United States Patent
Schallmoser

(10) Patent No.: US 7,197,683 B2
(45) Date of Patent: Mar. 27, 2007

(54) DIGITAL-TO-ANALOG CONVERSION WITH AN INTERLEAVED, PULSE-WIDTH MODULATED SIGNAL

(75) Inventor: Oskar Schallmoser, Ottobrunn (DE)

(73) Assignee: Patent-Treuhand-Gesellschaft fur Elektrisch Gluhlampen mbH (DE)

(*) Notice: Subject to any disclaimer, the term of this patent is extended or adjusted under 35 U.S.C. 154(b) by 248 days.

(21) Appl. No.: 11/073,682

(22) Filed: Mar. 8, 2005

(65) Prior Publication Data
US 2005/0206544 A1    Sep. 22, 2005

(30) Foreign Application Priority Data
Mar. 10, 2004 (DE) ............ 10 2004 011 723

(51) Int. Cl.
*G06F 11/00* (2006.01)
(52) U.S. Cl. .................... 714/740; 341/155
(58) Field of Classification Search .......... 341/145, 341/143, 152, 144, 155; 375/238; 714/740
See application file for complete search history.

(56) References Cited

U.S. PATENT DOCUMENTS

| | | | |
|---|---|---|---|
| 4,095,218 A * | 6/1978 | Crouse | 341/145 |
| 5,019,819 A * | 5/1991 | Kimura | 341/143 |
| 5,774,084 A | 6/1998 | Brombaugh et al. | 341/152 |
| 6,181,266 B1 * | 1/2001 | Toki | 341/152 |
| 6,538,484 B1 | 3/2003 | Rappaport et al. | 327/172 |
| 6,606,046 B2 * | 8/2003 | Kanno | 341/144 |
| 6,970,503 B1 * | 11/2005 | Kalb | 375/238 |
| 7,061,417 B2 * | 6/2006 | Chin | 341/144 |

FOREIGN PATENT DOCUMENTS

| | | |
|---|---|---|
| EP | 0 932 257 A2 | 7/1999 |
| GB | 2 288 932 A | 11/1995 |

OTHER PUBLICATIONS

"Digital-to-Analog Conversion by Pulse-Count Modulation Methods," Christian Halper et al., *IEEE Transactions on Instrumentation and Measurments*, vol. 45, No. 4, Aug. 1996, pp. 805-813.

Search Report from European Patent Office (for related foreign patent application) referencing the above-listed documents, dated Jun. 27, 2005 (3 pages total).

* cited by examiner

*Primary Examiner*—David Ton
(74) *Attorney, Agent, or Firm*—Fitch, Even, Tabin & Flannery

(57) ABSTRACT

The invention relates to a method and a circuit for digital-to-analog conversion, in which an interleaved pulse-width modulation signal (VPWM) is low-pass-filtered.

13 Claims, 4 Drawing Sheets

DIGITAL-TO-ANALOG CONVERSION WITH AN INTERLEAVED, PULSE-WIDTH MODULATED SIGNAL

TECHNICAL FIELD

The present invention relates to a method and a circuit for digital-to-analog conversion.

BACKGROUND ART

The conversion of digital signals to analog signals is a common problem in various fields of electronics. In addition to various other methods, low-pass filtering, inter alia, of a pulse-width modulated signal is known. In the case of the pulse-width modulated signal, the duration of a specific logic level, considered on its own or else as a so-called duty ratio in relation to the duration of the other logic level, represents the information to be transmitted. If averaging over time is now carried out by means of low-pass filtering, an analog signal is established by the average value and this signal continuously follows the time duration of the logic level or the duty ratio.

DISCLOSURE OF THE INVENTION

The invention is based on the technical problem of specifying a novel method and a novel circuit for digital-to-analog conversion having favorable properties.

The invention relates firstly to a method for digital-to-analog conversion in which an interleaved, pulse-width modulated signal is generated from a digital signal and the interleaved, pulse-width modulated signal is filtered using a filter having a low-pass characteristic, the interleaved, pulse-width modulated signal, in the case of at least some of the values of the digital signal, containing within a pattern repetition time at least two time subblocks having one specific logic state and at least two further time subblocks having another specific logic state, and the total of the pulse widths of the time subblocks representing the digital value, as well as to a correspondingly equipped circuit having a device for generating the interleaved, pulse-width modulated signal from the digital signal and a low-pass filter for filtering the interleaved, pulse-width modulated signal, which device is designed for the method according to the invention.

Preferred refinements are specified in the dependent claims.

In the description below, no distinction will now expressly be drawn between the method aspect and the apparatus aspect of the invention, with the result that the disclosure including the exemplary embodiment is to be understood as referring to both categories.

The invention thus relates to digital-to-analog conversion by means of low-pass filtering of a signal which is referred to here as an interleaved, pulse-width modulated signal. This is intended to express the fact that the signal, in contrast to a conventional pulse-width modulated signal, contains within a pattern repetition time more than one time subblock having a respective logic state. Instead, the interleaved, pulse-width modulated signal according to the invention is intended to be interleaved within the pattern repetition time by a plurality of time subblocks. A pattern repetition time is in this case to be understood to mean, starting from a constant, but arbitrary value for the digital signal to be converted, the minimum time with which the signal pattern of the interleaved, pulse-width modulated signal is repeated.

In this case, consideration should be taken of the fact that the pattern repetition time is not based on small time units within the interleaving which occur for quite specific (and not for arbitrary) values for the digital signal and with which a symmetry-dependent pattern is repeated. Such symmetries may result depending on the values. Instead, the pattern repetition time is the time which actually reproduces the digital value, i.e. the time with which the signal is repeated even in the case of asymmetrical interleaving patterns.

In the case of the interleaved pulse-width modulation signal according to the invention, there is thus a plurality of time subblocks having specific logic states, resulting in, in contrast to a conventional pulse-width modulation signal, a correspondingly increased number of signal state changes.

For more detailed illustrative purposes, the invention will be explained with reference to a preferred embodiment in which a conventional, pulse-width modulated signal is converted to an interleaved, pulse-width modulation signal according to the invention. Although this is a special case, it is also illustrative per se for understanding the interleaved, pulse-width modulated signal owing to the comparison of the two signals.

In this case, the basic idea of the invention thus consists in the pulse-width modulated signal being converted such that, by means of temporal subdivision, time subblocks are created which are arranged in a sequence which differs from the original subdivision. In this case, a pattern repetition time of the pulse-width modulated signal is taken into account, in the case of a signal having a fixed frequency, for example, one cycle. The pattern repetition time needs to contain at least one time block having a logic positive state and an adjoining time block having a logic negative state, but could also contain other time blocks. The temporal subdivision is in this case intended to create time subblocks which each have a unique logic state, i.e. a positive or a negative state. In particular, the boundary between the logic positive time block and the logic negative time block in the pattern repetition time is thus also intended again to correspond to a boundary between time subblocks following the subdivision.

The reordering is intended to take place in such a way that the number of logic state changes within the pattern repetition time is increased. Thus, if, for example, a pattern repetition time having precisely one logic positive time block and precisely one logic negative time block is used as the basis, two logic state changes are allotted to this pattern repetition time in the original state. If, however, the time subblocks are redistributed, in many cases more than two logic state changes will occur within the pattern repetition time. In the case which is preferred according to the invention, the number of logic state changes given predetermined subdivision into time subblocks is maximized. Finer subdivision of course allows maximization to an even larger number of state changes.

Simply reordering the time subblocks given constant logic values for the respective subblocks does not change the average value of the signal, which is obtained as an analog value by means of the low-pass filtering. However, the reordering makes it possible to achieve greater accentuation of higher-frequency frequency components and thus to achieve better filterability of the signal by means of the low-pass filter. If, for illustrative purposes, a low-pass filter in the form of a conventional RC element is envisaged, as a result of the reordering according to the invention of the time subblocks, the time intervals between the state changes are shorter, with the result that charge-reversal processes with smaller voltage amplitudes occur in the filter capacitor. The filtered signal thus has a "ripple" having a smaller amplitude and is thus filtered more effectively. In other words, it is possible to use simpler filters, for example those having smaller capacitors. Another possibility which in this case may come to the fore as a priority in circuit design or else may at the same time be of relevance is the possibility of smaller output impedances and thus smaller shifts as a result of fluctuating output currents.

The invention is thus concerned with distributing the time subblocks, which are defined by the subdivision in a conventional pulse-width modulated signal or in a signal according to the invention which is generated in another way, over the pattern repetition time such that there are smaller time intervals between the state changes. Of course, this statement applies depending on the value represented. In particular in the case of values right at the boundary of the value range which can be represented, the result may be that the time block having the logic positive or negative state now corresponds only to a single time subblock and thus no increase in the number of state changes can be achieved for this one value or for the two outermost values of the value range which can be represented by means of reordering. In principle, similar exceptions could also occur for other values depending on the reordering system. However, it is critical that to a certain extent, as an average of all of the occurring values, overall an increase in the number of state changes and thus also a reduction in the time intervals is achieved.

Even a certain even distribution of the time subblocks having a specific logic state is preferably desired, i.e. the logic positive within the logic negative, or vice versa. However, a real even distribution within the pattern repetition time would be advantageous as regards filterability, but under certain circumstances would be more complicated as regards the necessary redistribution processes than other systems which merely approximate an even distribution. The invention thus considers even those redistributions as particularly favorable in which, at least over approximately half of the pattern repetition time, an even distribution of time subblocks is achieved. (In order to avoid misunderstandings: Even distribution is not intended to be achieved in the sense of having the same number of logic negative and logic positive time subblocks, rather a uniform distribution of the time subblocks with the less common logic value within the remaining time subblocks.)

It has already been mentioned above that the conversion of a conventional pulse-width modulation signal is only one possibility for carrying out the method according to the invention. It is also possible to generate a pulse-width modulation signal, which has been interleaved according to the invention, on the basis of another digital signal. One preferred procedure is in this case based on comparing the signal values of the digital signal to be converted with a signal which is obtained by means of bit interchange of a counter signal. This is because conventional pulse-width modulated signals can be generated by the corresponding digital value being compared with a monotonically rising or monotonically falling step signal, i.e. a counter signal. Depending on how high the digital value is, the state change takes place earlier or later within the pattern repetition time. If the counter signal is now changed by means of bit interchange prior to the comparison and then no longer falls or rises monotonically, in this manner an interleaved pulse-width modulation signal according to the invention can be generated. The result of the comparison differs from the result of the comparison in the case of the conventional pulse-width modulation signal only by reordering within the pattern repetition time. Averaging by means of subsequent low-pass filtering is not affected thereby.

Bit interchange of the counter signal is particularly preferred in which (at least) the least significant bit (LSB) is put in the place of the most significant bit (MSB). A preferred special case envisages that the bit sequence is entirely inverted, i.e. the most significant bit is put in the place of the least significant bit, the second most significant bit is put in the place of the second least significant bit etc. In a technically simple manner, highly interleaved pulse-width modulation signals thus result without an actual conventional pulse-width modulation signal being redistributed. In this embodiment, the redistribution instead takes place as early as in the counter signal prior to the comparison.

A further preferred refinement envisages that for the bit interchange, for example also for bit inversion in accordance with the above explanation, a so-called look-up table is used, i.e. a memory in which the bit interchange is implemented by means of the memory entries at the respective addresses. In this manner, even more complex interchange patterns can be implemented easily if the structure of the look-up table is established. In particular, it would thus also be possible to implement complete even distribution of the time subblocks within the pattern repetition time.

The invention also relates to a circuit for carrying out the method described which correspondingly has a device for generating the interleaved, pulse-width modulated signal from the digital signal and a low-pass filter. It also has, in the various preferred refinements, corresponding devices for the method steps described. The above description of the method can in this case be understood as a functional determination of the apparatus features, i.e. of the corresponding devices in the circuit.

The low-pass filter may have a different design. In the context of this invention, an RC filter, in particular a second-order RC filter, is preferred.

The invention preferably relates to an electronic ballast for a light-emitting apparatus, in particular a lamp or an LED in the construction of which such a circuit is used. This electronic ballast is a preferred application, although the method and the apparatus for digital-to-analog conversion may also be used in many other technical fields.

Microcontrollers are also used in electronic ballasts. In this case, a digital signal from the microcontroller can be connected to the possibly integrated device for generating the interleaved pulse-width modulated signal in order in this way to finally generate an analog signal by means of low-pass filtering. In particular, in this case an analog signal can be generated in a simple and efficient manner as an output signal (which can be averaged) from the microcontroller, the abovementioned advantages as regards filterability of the signal and the demands on the filter being achieved by the invention.

The lamp is preferably a discharge lamp and in the context of this invention is particularly preferably a discharge lamp which is designed for so-called dielectrically impeded discharges. Such discharge lamps require special ballasts which bring about a pulsed power injection into the discharge lamp.

BRIEF DESCRIPTION OF THE DRAWINGS

The invention will be explained in more detail below with reference to two exemplary embodiments. The features disclosed here may also be essential to the invention in other combinations and relate to both the method and the apparatus aspects of the invention. In detail, in the drawings.

BEST MODE FOR CARRYING OUT THE INVENTION

Figure 1:
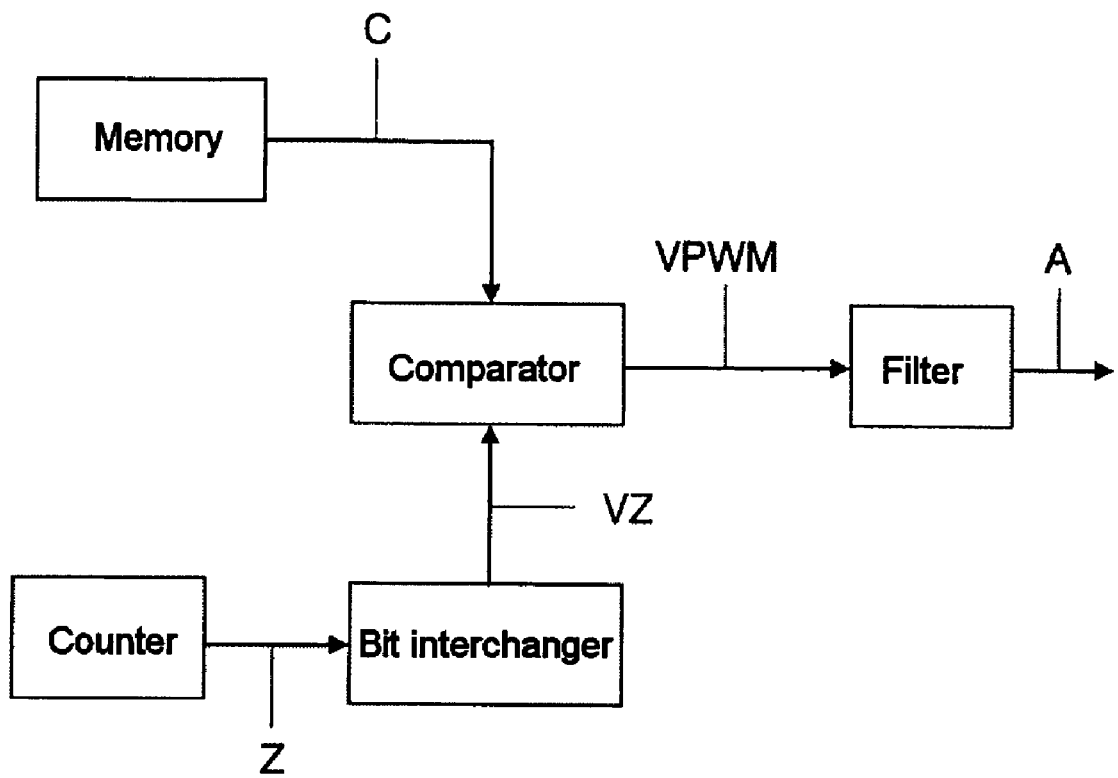
FIG. 1 shows a schematic diagram of a first exemplary embodiment of the invention.

FIG. 1 shows, using a block diagram, the principle of the invention in a first exemplary embodiment. The method steps explained below with reference to separate components are implemented in this exemplary embodiment actually inside a microcontroller shown in FIG. 2, with the exception of the filter.

A memory contains digital values C as the digital signal which are input in a comparator. There, they are compared with a signal which is generated by means of bit interchange from a signal Z from a counter. For this purpose, reference is made to the explanations for FIGS. 3 and 4. The comparator generates, by means of the comparison between the digital signal C and the interleaved counter signal VZ from the bit interchanger, an interleaved, pulse-width modulated signal VPWM which is given to a filter, in this case a second-order RC element, and is filtered there to form an analog signal A.

Figure 2:
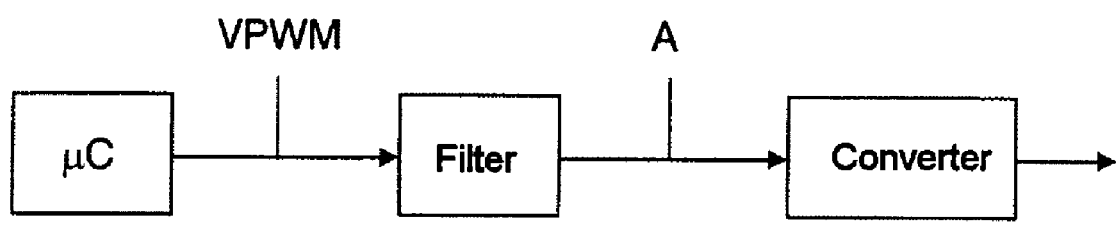
FIG. 2 shows a schematic diagram of an electronic ballast according to the invention in which the exemplary embodiment shown in FIG. 1 is used.

FIG. 2 shows, likewise using a block diagram, an exemplary embodiment in which a microcontroller, which is given the designation pC in the figure, outputs the interleaved, pulse-width modulated signal VPWM shown in FIG. 1. The microcontroller contains the memory and the counter shown in FIG. 1. The bit interchange is implemented in the form of a look-up table, i.e. likewise as a memory. The comparator is implemented using software technology.

The comparator itself can likewise be implemented in the form of a look-up table, i.e. in a memory. In this case, use can be made of the fact that in many applications, for example in the case of the current disconnection value in this exemplary embodiment, the value for C changes rarely, little in amount and in the process slowly. Not only the bit-interchanged counter signal VZ but even the comparator output signal VPWM is thus stored in a look-up table, to be precise provided there is a specific value for C. Depending on the memory space available, a few adjacent C values could likewise be taken into account in this look-up table. Since the C values in this case can only change slowly, a program running in the background can if necessary write the look-up table anew in order to take into account new C values. It is thus possible, overall, to prevent computational power being blocked during operation by the repeatedly occurring comparison operations.

The interleaved pulse-width modulation signal VPWM passes through the filter shown in FIG. 1 whose analog output signal A is applied to a so-called Class E converter for the purpose of driving a dielectrically impeded discharge lamp. Specifically, this is a current disconnection value of an inverter in the Class E converter which is stored in the form of the digital signal C in the memory of the microcontroller and must be fed to the Class E converter as an analog signal A. The invention thus generates from a digital memory value of the microcontroller of the Class E converter an analog signal for driving purposes and thus replaces an analog output of the microcontroller μC.

Figure 3:
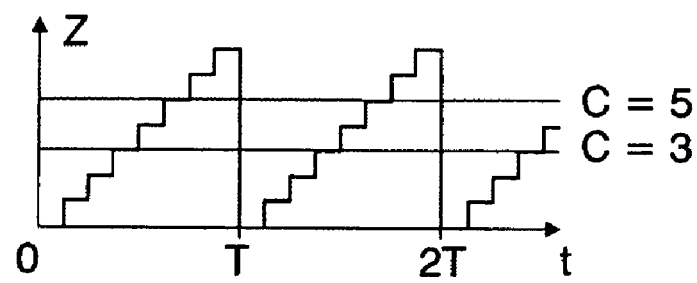
FIG. 3 shows, with reference to timing diagrams, the generation of a pulse-width modulated signal according to the prior art.
Figure 3:
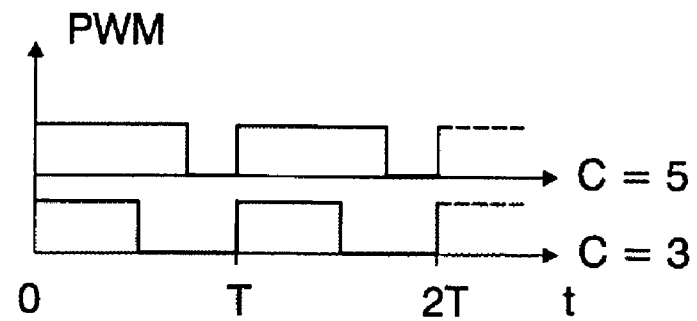
Figure 4:
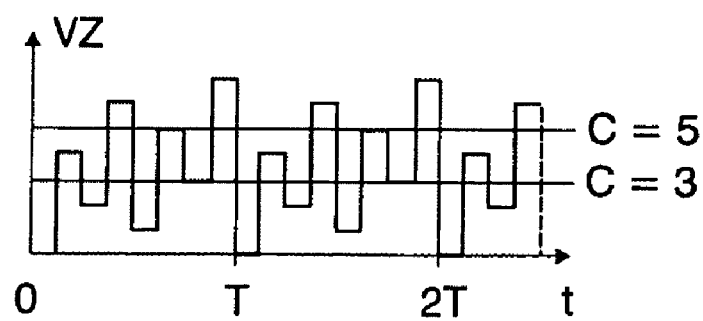
FIG. 4 shows, analogously to FIG. 3, the generation of an interleaved, pulse-width modulated signal in analogy to the exemplary embodiment shown in FIG. 1.
Figure 4:
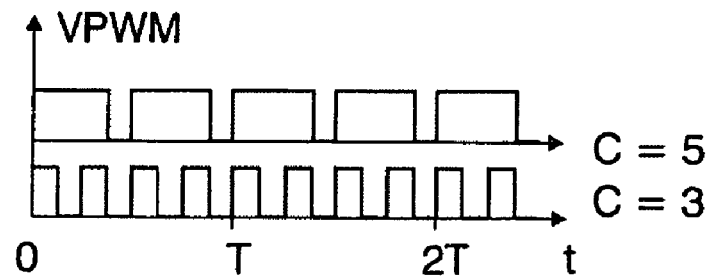

FIG. 3 serves the purpose of illustrating FIGS. 1 and 4, but shows the prior art. The upper region of FIG. 3 shows the counter signal Z from FIG. 1, namely a signal which rises monotonically and stepwise, over the time profile t. The horizontal lines symbolize two exemplary values for the digital value C, to be precise 5 and 3. For simplification purposes, in this case a 3-bit system having the values from 0 to 7 is assumed. It can be seen that the signal rises beyond the value for C after specific times, to be precise up to the end of the pattern repetition time given the designation T. The time profile, shown in the lower region in FIG. 3, of a conventional pulse-width modulated signal PWM is thus produced by means of a comparator which is fed directly the signal Z in place of the bit-interchanged signal VZ used in FIG. 1. Within the time component of the pattern repetition time T in which the value C is greater than or equal to the counter signal Z, this pulse-width modulated signal PWM has a logic positive high-level state and thereafter a low-level state. This pattern is repeated with the pattern repetition time T and is illustrated for the two exemplary values 5 and 3 for the value for C. It can be seen that the conventional pulse-width modulation signal PWM generally has two state changes within the pattern repetition time, it being possible for there to be exceptions in the case of the boundary values C=0 and C=7 (in the case of a 3-bit variant).

The diagram in FIG. 4 can thus be better understood by the principle according to the invention likewise being illustrated for a simplified 3-bit case. In this case, the upper region shows the bit-interchanged counter signal VZ in which the underlying bit sequence has been completely inverted, i.e. in this example the first bit has been put in the place of the third bit and in the case of an 8-bit system, the first bit has been put in the place of the eighth bit, the second bit in the place of the seventh bit, the third bit in the place of the sixth bit and vice versa. This results in the non-monotonic profile illustrated for the bit-interchanged counter signal VZ. It can also be seen that again a pattern repetition time T of the same length as in FIG. 3 can be established. The corresponding comparator output signal VPWM now shows, depending on the digital value C, a plurality of state changes within the pattern repetition time T, to be precise, for example, four state changes where C=5 and eight state changes where C=3. These are evenly distributed at least over half of the pattern repetition time. Reference should be made to the fact that there are also values for C (to be precise at the boundary of the value range for C) in which the number of state changes does not increase. However, it can already be seen that the interleaved, pulse-width modulated signal VPWM generally has a proportion of higher-frequency components which is higher than in the conventional pulse-width modulated signal PWM or that the average time interval between state changes and thus the charge-reversal times for example in the capacitance of an RC filter are shorter.

Further advantages are explained with reference to FIGS. 5 and 6 which do however relate to a real 8-bit example.

Figure 5:
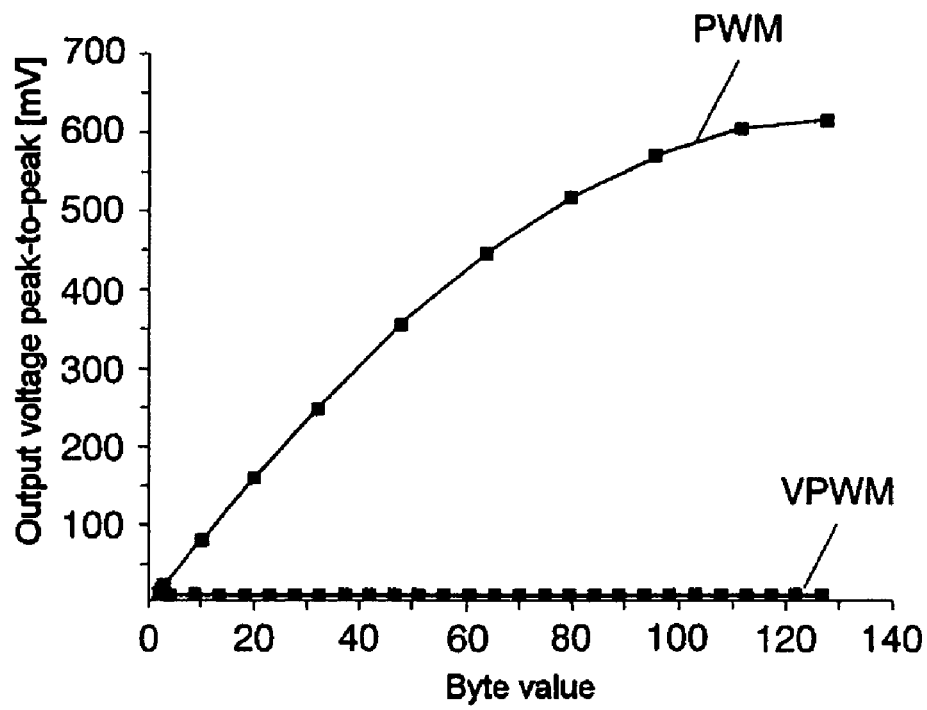
FIG. 5 shows a graph of the absolute level of the AC component of a low-pass-filtered signal A shown in FIG. 1 against the byte value.
Figure 6:
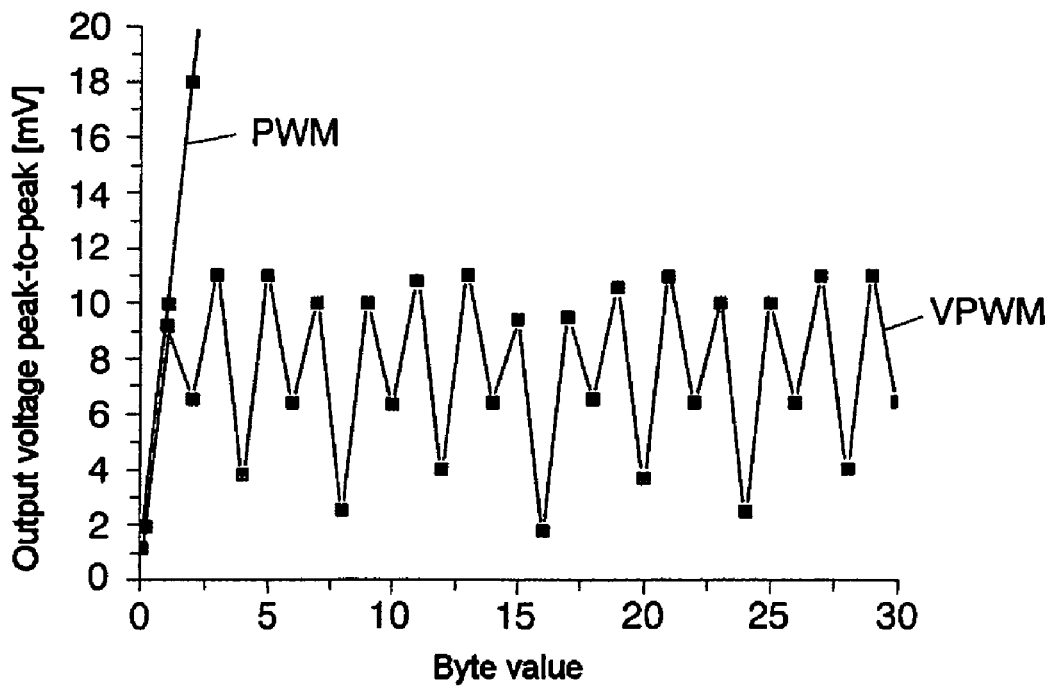
FIG. 6 shows a detail from FIG. 5.

FIG. 5 shows the absolute level of the AC component, i.e. the peak-to-peak value of the output voltage (in mV) after low-pass filtering in accordance with FIG. 1, to be precise, on the one hand, with the precondition of the procedure according to the invention in accordance with FIG. 1 which is symbolized by VPWM and, on the other hand, with the precondition of the conventional procedure in accordance with FIG. 3 in which the bit interchanger in FIG. 1 is thus omitted and the counter signal Z is fed directly to the comparator. The conventional case is given the designation PWM. With reference to FIG. 3, it can be seen that given small C values initially temporally short, high-level and temporally long, low-level components occur in the pulse-width modulated signal and thus only low capacitive charging can take place. For high C values, the reverse is true.

The peak-to-peak voltage value illustrated in FIG. 5 following filtering is consequently low near the boundary of the byte value range which in the present 8-bit case extends from 0-255. However, the peak-to-peak voltage value rises on both sides symmetrically up to the center of the byte value range where C=127, where in this case approximately 620 mV of ripple are produced.

As can hardly be seen in FIG. 5 and in the vicinity of the horizontal axis, the ripple value for the case according to the invention is illustrated and given the designation VPWM. FIG. 6 shows this graph for the first 30 byte values as a detail. It can be seen that only for the first boundary byte values is there a correspondence between the conventional case and the case according to the invention. However, in this range there is no high ripple value even in the conventional case. The interleaving, illustrated in FIG. 4, of the pulse-width modulation signal according to the invention, however, given increasing byte values, does not result in any longer capacitive charging phases, since they are repeatedly subdivided and distributed by the interleaving. The ripple value for the entire byte value range thus remains in a range below approximately 12 mV, which corresponds to an improvement of up to 34 dB compared to the conventional case. Here, in both cases identical low-pass filters were assumed which are implemented in this case with standard SMD components. As a result of the markedly improved analog signal quality, it would however be possible also to place lesser demands on the filter, as has already been explained above.

Figure 7:
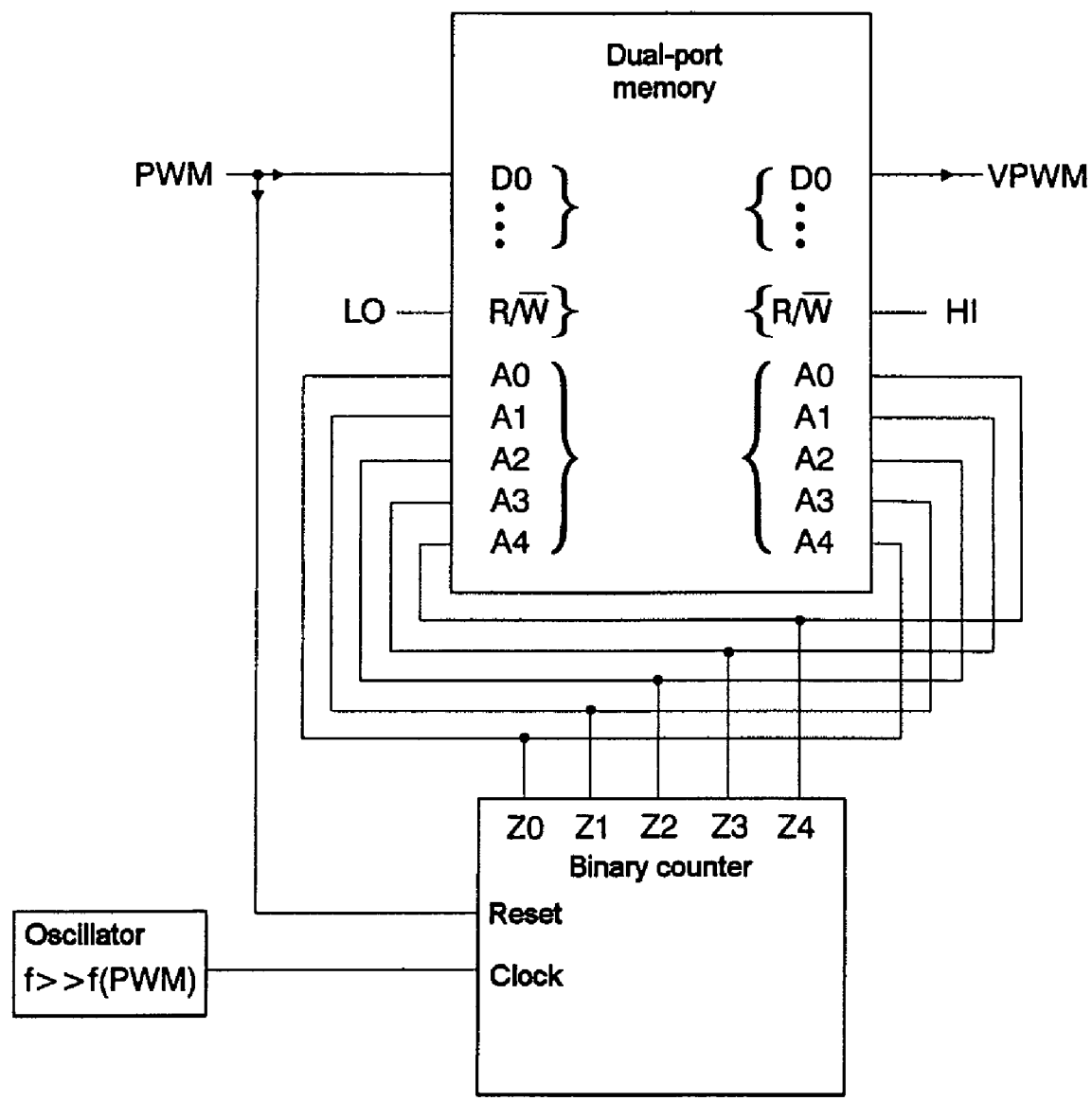
FIG. 7 shows a schematic illustration of a second exemplary embodiment.

FIG. 7 shows a second exemplary embodiment of the invention. In this case, a so-called dual-port memory is illustrated. Such a dual-port memory has address and data-bus systems which operate independently of one another. The dual-port memory has data connections D0 et seq., of which only D0 is illustrated and required for this exemplary embodiment. Using further data inputs, further signals could be converted in the manner described below.

FIG. 7 shows the fact that a pulse-width modulated signal given the designation PWM is applied to D0, and, on the right-hand side, a pulse-width modulated signal VPWM which has been interleaved in the manner according to the invention is tapped off at a further D0 connection. For this purpose, a connection therebelow which is given the designation R/W is at the low level (LO) on the left and at the high level (HI) on the right, a distinction thereby being drawn between writing (on the left) and reading (on the right).

The signal PWM is written sequentially in time to memory locations which have 5 bit addresses with the positions A0 to A4. For writing purposes, the addresses are input on the left-hand side. For reading purposes, they are input on the right-hand side. This takes place by means of a binary counter illustrated below having outputs Z0 to Z4. With the first rising edge the binary counter is reset and then increments the addresses of the memory locations via the outputs Z0 to Z4. Correspondingly, the PWM signal is written sequentially in time.

FIG. 7 shows the fact that the outputs Z0 to Z4 of the binary counter are connected to the address bit connections A0 to A4 on the right-hand side in a bit-interchanged manner. The signal values are thus read from the memory locations by means of bit interchange with temporal inter-leaving, resulting in the interleaved signal VPWM mentioned above. In this case, the operation of the binary counter is controlled with the same clock as the clock (not illustrated) of the dual-port memory. This clock has a considerably higher frequency f than that of the pulse-width modulated signal PWM (f>>f (PWM) ), to be precise in this example exactly $2^5$ times the pulse-width modulated signal PWM. In this case, the number of memory locations having the 5-bit addresses together with the clock rate is matched such that one cycle of the signal PWM occupies all of the memory addresses, namely in this case $2^5$.

This exemplary embodiment thus shows the subdivision of the signal PWM into time subblocks corresponding to the individual memory locations and the temporal reordering of the time subblocks by means of bit interchange of the memory addresses. In contrast to the previous exemplary embodiment, in this case there is thus initially a conventional PWM signal.

What is claimed is:

1. A method for digital-to-analog conversion,
   in which an interleaved, pulse-width modulated signal is generated from a digital signal, and
   the interleaved, pulse-width modulated signal is filtered using a filter having a low-pass characteristic,
   the interleaved, pulse-width modulated signal, in the case of at least some of the values of the digital signal, containing within a pattern repetition time at least two time subblocks having one specific logic state and at least two further time subblocks having another specific logic state, and
   the total of the pulse widths of the time subblocks representing the digital value.

2. The method as claimed in claim 1, in which the digital signal is a pulse-width modulated signal, and
   the interleaved, pulse-width modulated signal is generated from the pulse-width modulated signal by a time block having a specific logic state being temporally subdivided into a plurality of time subblocks within a pattern repetition time of the pulse-width modulated signal, and
   these time subblocks are reordered in such a way that the number of logic state changes within the pattern repetition time is increased.

3. The method as claimed in claim 2, in which the number of logic state changes within the pattern repetition time is maximized.

4. The method as claimed in claim 2 in which, at least over half of the pattern repetition time, a respective even distribution of time subblocks having a specific logic state is achieved.

5. The method as claimed in claim 1, in which the interleaved, pulse-width modulated signal is generated by comparing the respective signal values of the digital signal with a signal which is generated by means of bit interchange from a digital counter signal.

6. The method as claimed in claim 5, in which the digital counter signal is bit-interchanged such that the least significant bit is put in the place of the most significant bit.

7. The method as claimed in claim 6, in which the bit sequence is inverted.

8. The method as claimed in claim 5, in which a look-up table is used for bit-interchange purposes.

9. A circuit for carrying out the method as claimed in claim 1 having
   a device for generating the interleaved, pulse-width modulated signal from the digital signal, and
   a low-pass filter for filtering the interleaved, pulse-width modulated signal.

10. The circuit as claimed in claim 9, in which the low-pass filtering takes place using a second-order RC filter.

11. A circuit for carrying out claim 2 having the method as claimed in a device for generating the interleaved, pulse-width modulated signal from the digital signal, and a low-pass filter for filtering the interleaved, pulse-width modulated signal, and in which the low-pass filtering takes place using a second-order RC filter.

12. An electronic ballast for a light-emitting apparatus, in particular a lamp or an LED, having the circuit as claimed in claim 9.

13. The electronic ballast as claimed in claim 12 having a microcontroller, a digital signal from the microcontroller being connected to the device for generating the interleaved, pulse-width modulated signal.

* * * * *